(12) United States Patent
Nanba et al.

(10) Patent No.: US 11,696,517 B2
(45) Date of Patent: Jul. 4, 2023

(54) QUANTUM DEVICE AND METHOD OF MANUFACTURING THE SAME

(71) Applicant: NEC Corporation, Tokyo (JP)

(72) Inventors: Kenji Nanba, Tokyo (JP); Ayami Yamaguchi, Tokyo (JP); Akira Miyata, Tokyo (JP); Katsumi Kikuchi, Tokyo (JP); Suguru Watanabe, Tokyo (JP); Takanori Nishi, Tokyo (JP); Hideyuki Satou, Tokyo (JP)

(73) Assignee: NEC CORPORATION, Tokyo (JP)

( * ) Notice: Subject to any disclaimer, the term of this patent is extended or adjusted under 35 U.S.C. 154(b) by 199 days.

(21) Appl. No.: 17/349,281

(22) Filed: Jun. 16, 2021

(65) Prior Publication Data

US 2021/0399194 A1    Dec. 23, 2021

(30) Foreign Application Priority Data

Jun. 19, 2020    (JP) .................................. 2020-106152

(51) Int. Cl.
*G06N 10/00* (2022.01)
*H10N 60/81* (2023.01)
*H10N 60/01* (2023.01)

(52) U.S. Cl.
CPC ............. *H10N 60/81* (2023.02); *H10N 60/01* (2023.02); *G06N 10/00* (2019.01)

(58) Field of Classification Search
None
See application file for complete search history.

(56) References Cited

FOREIGN PATENT DOCUMENTS

JP    2019-537239 A    12/2019

*Primary Examiner* — Matthew L Reames
(74) *Attorney, Agent, or Firm* — Sughrue Mion, PLLC

(57) ABSTRACT

A quantum device (100) includes: an interposer (112); a quantum chip (111); and a connection part (130) that is provided between the interposer (112) and the quantum chip (111) and electrically connects a wiring layer of the interposer (112) to a wiring layer of the quantum chip (111), in which the connection part (130) includes: a plurality of pillars (131) arranged on a main surface of the interposer (112); and a metal film (132) provided on a surface of the plurality of pillars (131) in such a way that it contacts the wiring layer of the quantum chip (111) and the thickness of the metal film at outer peripheral parts of the tip of each of the plurality of pillars (131) becomes larger than the thickness of the metal film at a center part of the tip of each of the plurality of pillars (131).

9 Claims, 6 Drawing Sheets

QUANTUM DEVICE AND METHOD OF MANUFACTURING THE SAME

INCORPORATION BY REFERENCE

This application is based upon and claims the benefit of priority from Japanese patent application No. 2020-106152, filed on Jun. 19, 2020, the disclosure of which is incorporated herein in its entirety by reference.

TECHNICAL FIELD

The present disclosure relates to a quantum device and a method of manufacturing the same.

BACKGROUND ART

A quantum device formed of a superconducting material is mounted on a quantum computer device. This quantum device is placed in a cryogenic environment, whereby this quantum device is able to achieve operations that utilize superconducting phenomena. The cryogenic temperature indicates, for example, about 9 K when niobium (Nb) is used and about 1.2 K when aluminum (Al) is used.

A technique that relates to a quantum device is disclosed, for example, in Published Japanese Translation of PCT International Publication for Patent Application No. 2019-537239. Published Japanese Translation of PCT International Publication for Patent Application No. 2019-537239 discloses a structure in which a quantum dot device package and an interposer are coupled to each other by coupling components (including solder balls and the like).

Published Japanese Translation of PCT International Publication for Patent Application, No. 2019-537239 does not specifically disclose, however, how the quantum dot device package (quantum chip) and the interposer are coupled to each other by the coupling components. Accordingly, in Published Japanese Translation of PCT International Publication for Patent Application, No. 2019-537239, when, for example, devices are cooled down, an unintended stress that occurs due to a difference in thermal expansion coefficients of the respective members is applied to the coupling components, whereby it is possible that a good coupling by the coupling components cannot be maintained. That is, there is a problem in the structure disclosed in Published Japanese Translation of PCT International Publication for Patent Application, No. 2019-537239 that the quality of the quantum device is reduced.

SUMMARY

An object of the present disclosure is to provide a quantum device and a method of manufacturing the same that solve the aforementioned problem.

According to one example embodiment, a quantum device includes: an interposer; a quantum chip; and a connection part that is provided between the interposer and the quantum chip and electrically connects a wiring layer of the interposer to a wiring layer of the quantum chip, in which the connection part includes: a plurality of pillars arranged on a main surface of the interposer; and a metal film provided on a surface of the plurality of pillars in such a way that it contacts the wiring layer of the quantum chip and the thickness of the metal film at outer peripheral parts of the tip of each of the plurality of pillars becomes larger than the thickness of the metal film at a center part of the tip of each of the plurality of pillars.

According to one example embodiment, a method of manufacturing a quantum device includes: arranging a plurality of pillars on a main surface of an interposer; providing a metal film on a surface of the plurality of pillars; and arranging a quantum chip on the main surface of the interposer in such a way that a wiring layer of the quantum chip contacts the metal film, in which the metal film is provided in such a way that the thickness of the metal film at outer peripheral parts of the tip of each of the plurality of pillars becomes larger than the thickness of the metal film at a center part of the tip of each of the plurality of pillars.

BRIEF DESCRIPTION OF DRAWINGS

The above and other aspects, features and advantages of the present disclosure will become more apparent from the following description of certain exemplary embodiments when taken in conjunction with the accompanying drawings, in which.

EMBODIMENTS

Figure 1:
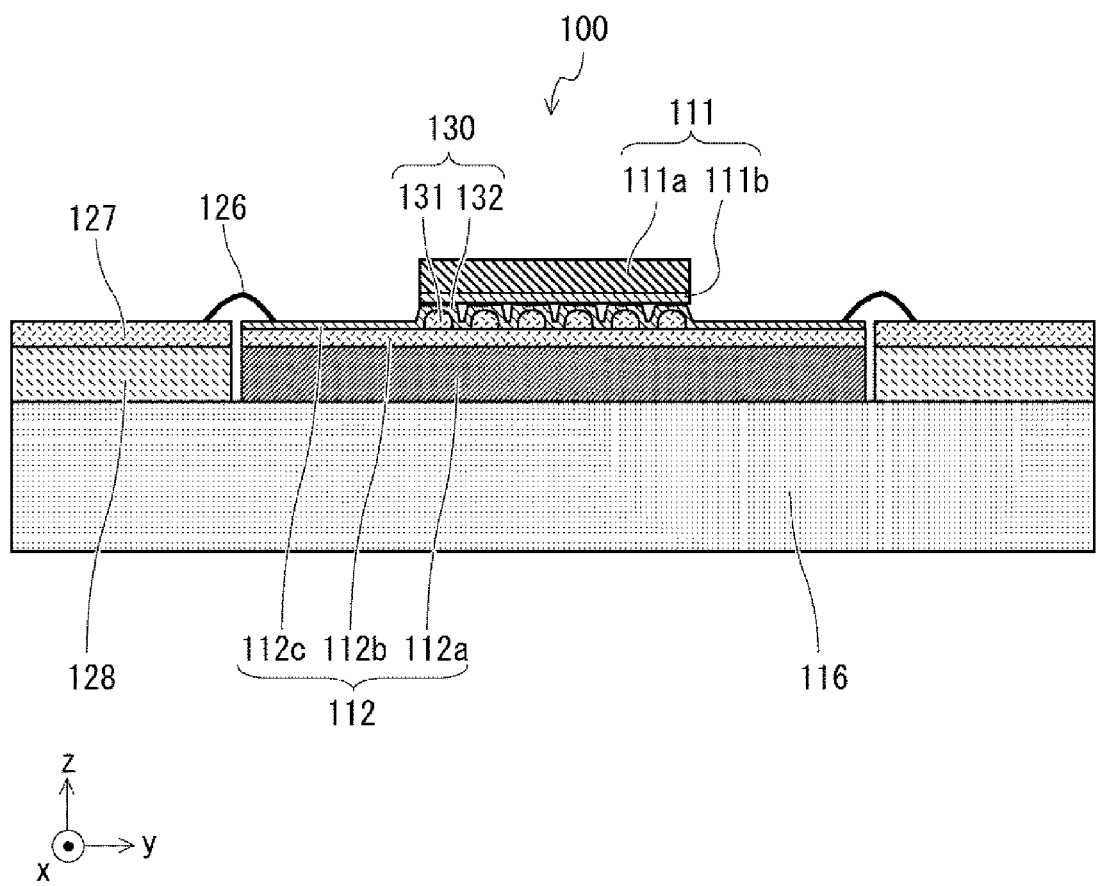
FIG. 1 is a schematic cross-sectional view of a quantum device according to a first example embodiment.

Example embodiments of the present invention will be described below with reference to the accompanying drawings. Note that the drawings are in simplified form and the technical scope of the example embodiments should not be interpreted to be limited to the drawings. The same elements are denoted by the same reference numerals and a duplicate description is omitted.

In the following example embodiments, when necessary, the present invention is explained by using separate sections or separate example embodiments. However, those example embodiments are not unrelated with each other, unless otherwise specified. That is, they are related in such a manner that one example embodiment is a modified example, an application example, a detailed example, or a supplementary example of a part or the whole of another example embodiment. Further, in the following example embodiments, when the number of elements or the like (including numbers, values, quantities, ranges, and the like) is mentioned, the number is not limited to that specific number except for cases where the number is explicitly specified or the number is obviously limited to a specific number based on its principle. That is, a larger number or a smaller number than the specific number may also be used. For example, a plurality of quantum chips and a plurality of interposers may be formed.

Further, in the following example embodiments, the components (including operation steps and the like) are not necessarily indispensable except for cases where the component is explicitly specified or the component is obviously indispensable based on its principle. Similarly, in the following example embodiments, when a shape, a position relation, or the like of a component(s) or the like is mentioned, shapes or the like that are substantially similar to or resemble that shape are also included in that shape except for cases where it is explicitly specified or they are eliminated based on its principle. This is also true for the above-described number or the like (including numbers, values, quantities, ranges, and the like).

In the following, quantum computing refers to the field of utilizing quantum mechanical phenomena (quantum bits) to manipulate data. These quantum mechanical phenomena include superposition of a plurality of states (in which a quantum variable simultaneously exists in multiple different states) and entanglement (a state in which multiple quantum variables have related states irrespective of space or time). A quantum circuit that generates quantum bits is provided in a quantum chip.

<Study in Advance by Inventors>

Prior to giving the description of a quantum device 100 according to a first example embodiment, contents studied in advance by the inventors will be described.

Figure 5:
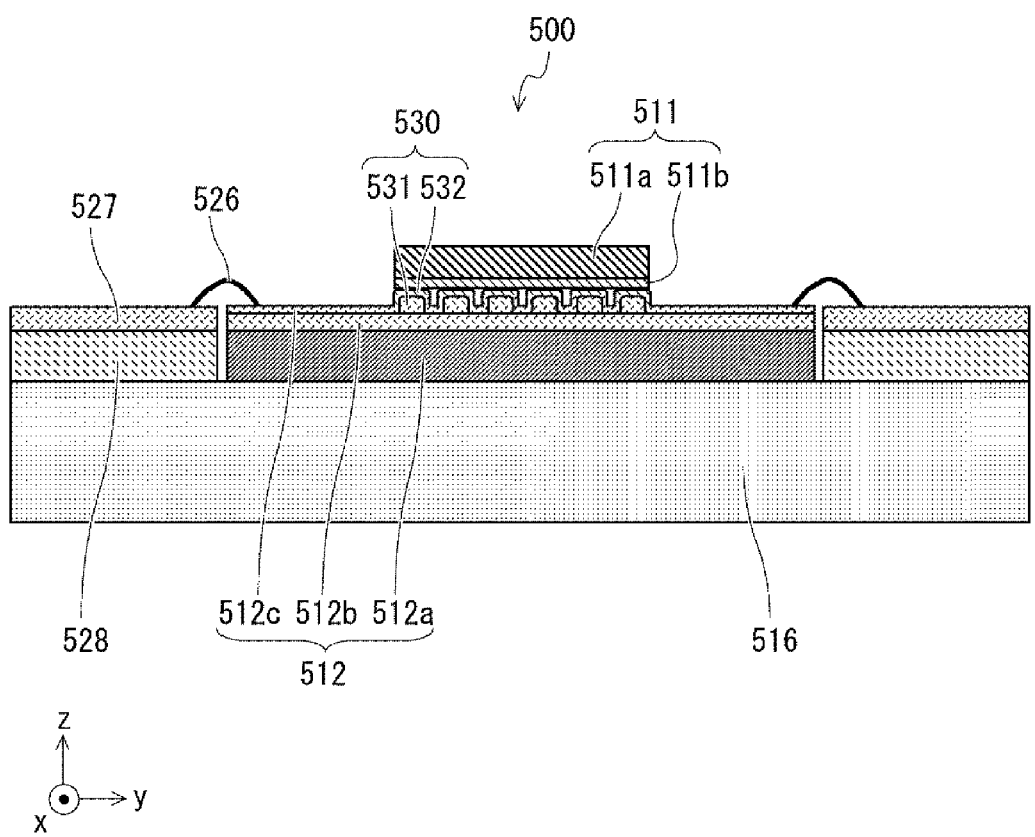
FIG. 5 is a schematic cross-sectional view of a quantum device in a conceptual stage.
Figure 6:
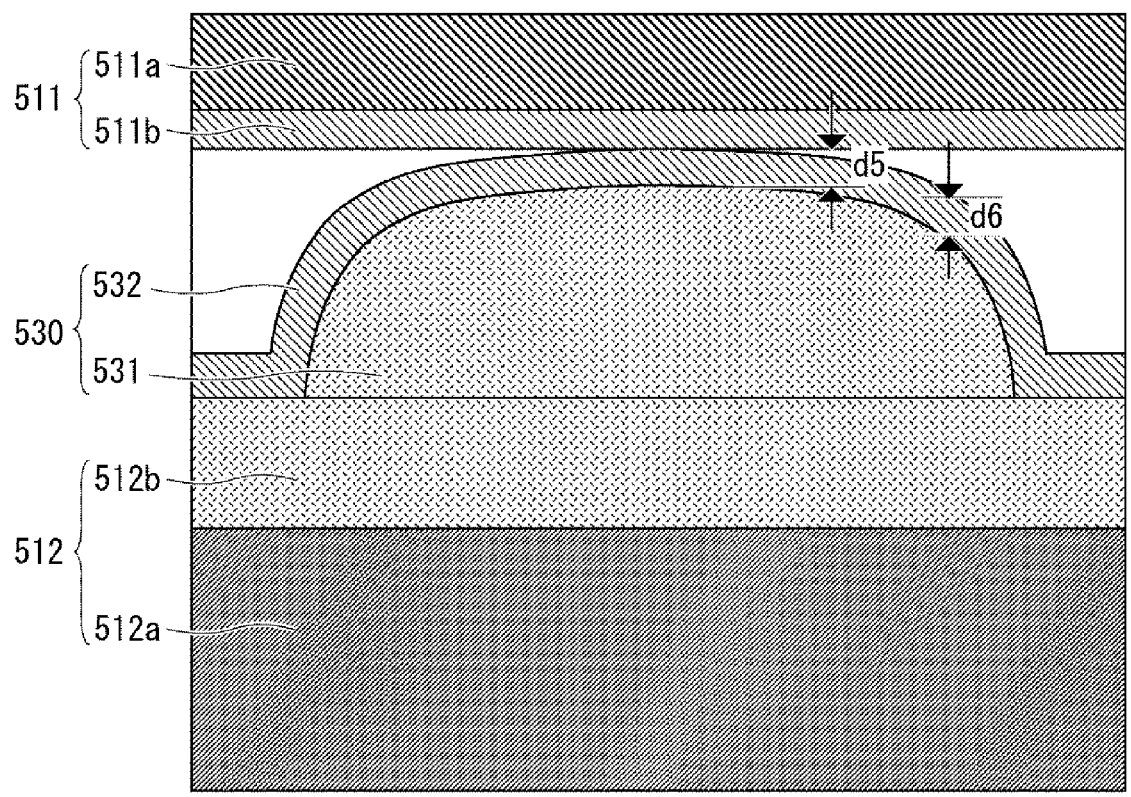
FIG. 6 is a schematic cross-sectional view in which a connection part of the quantum device shown in FIG. 5 is enlarged.

FIG. 5 is a schematic cross-sectional view of a quantum device 500 in a conceptual stage before reaching the first example embodiment. Further, FIG. 6 is a schematic perspective view in which a connection part of the quantum device 500 shown in FIG. 5 is enlarged. The quantum device 500 is mounted on a quantum computer device and placed in a cryogenic environment, whereby operations that utilize superconductive phenomena are achieved.

Specifically, the quantum device 500 includes a quantum chip 511, an interposer 512, a connection part 530, a sample table 516, a base substrate 528, and a bonding wire 526.

The interposer 512 and the base substrate 528 are arranged in proximity to each other on the main surface of the sample table 516. The sample table 516 includes a cooling function.

The interposer 512 includes an interposer substrate 512a, a wiring layer 512b, and a metal film 512c. The wiring layer 512b is formed on one main surface (the surface that is opposite to the surface that contacts the sample table 516) of the interposer substrate 512a (hereinafter it may also be simply referred to as an interposer 512), and the metal film 512c is further formed on the surface of the wiring layer 512b as a part of the wiring layer 512b.

The wiring layer 512b is formed of one of a superconducting material and a normal conducting material. The superconducting material is, for example, a metallic material such as niobium (Nb), niobium nitride (NbN), aluminum (Al), indium (In), lead (Pb), tin (Sn), rhenium (Re), palladium (Pd), titanium (Ti), titanium nitride (TiN), tantalum (Ta), and an alloy including any of them. The normal conducting material is, for example, a metallic material such as copper (Cu), silver (Ag), gold (Au), platinum (Pt), and an alloy including any of them. In this example, a case in which the wiring layer 512b is made of Cu, which is a normal conducting material, will be described.

Further, the metal film 512c is formed of a superconducting material. The superconducting material is, for example, a metallic material such as niobium (Nb), niobium nitride (NbN), aluminum (Al), indium (In), lead (Pb), tin (Sn), rhenium (Re), palladium (Pd), titanium (Ti), titanium nitride (TiN), tantalum (Ta), and an alloy including any of them. In this example, a case in which the metal film 512c is made of Nb will be described.

The quantum chip 511 includes a quantum chip body 511a and a wiring layer 511b. The wiring layer 511b is formed on one main surface of the quantum chip body 511a (hereinafter it may also be simply referred to as a quantum chip 511). The wiring layer 511b of the quantum chip 511 is formed of a superconducting material. In this example, a case in which the wiring layer 511b is made of Nb will be described.

The quantum chip 511 and the interposer 512 are arranged in such a way that the wiring layers thereof are opposed to each other.

The connection part 530 is provided between the quantum chip 511 and the interposer 512 and electrically connects the wiring layer 511b of the quantum chip 511 to the wiring layer 512b of the interposer 512. Accordingly, signals can be transferred between the quantum chip 511 and the interposer 512. Non-contact signal transfer may also be performed between the quantum chip 511 and the interposer 512.

Specifically, the connection part 530 includes a plurality of pillars 531 and a metal film 532. The plurality of pillars 531 are formed (arranged) so as to be protruded from one main surface of the interposer 512. For example, a center part of the tip of each of the pillars 531 is projecting greatest from one main surface of the interposer 512 and outer peripheral parts of the tip of each of the pillars 531 are rounded (have a round shape). The metal film 532 is formed (arranged) on a surface of the plurality of pillars 531. The metal film 532 is formed on the surface of the plurality of pillars 531 so as to be continuous with the metal film 512c formed on the surface of the wiring layer 512b of the interposer 512.

Note that the plurality of pillars 531 are made of one of a superconducting material and a normal conducting material. In this example, a case in which the plurality of pillars 531 are made of Cu, which is a normal conducting material, will be described. Further, the metal film 532 is formed of a superconducting material, just like the metal film 512c. In this example, a case in which the metal film 532 is made of Nb will be described.

The wiring layer 512b of the interposer 512 (including the metal film 512c) and a wiring layer 527 of the base substrate 528 are connected to each other via the bonding wire 526. Accordingly, signal lines (terminals) of the quantum chip 511 are externally drawn out via the interposer 512 and the bonding wire 526.

Further, heat in the quantum chip 511 is dissipated to the sample table 516 having a cooling function via the interposer 512. Accordingly, the quantum device 500 is maintained in a cryogenic state where superconducting phenomena can be utilized.

As shown in FIG. 6, in the connection part 530 provided in the quantum device 500, the metal film 532 formed on the surface of the pillars 531 has a uniform thickness. Specifically, a thickness d5 of the metal film 532 at a center part of the tip of each of the pillars 531 is about the same as a thickness d6 of the metal film 532 at outer peripheral parts of the tip of each of the pillars 531. Accordingly, the size of the area where the connection part 530 contacts the wiring layer 511b of the quantum chip 511 is small, which may cause, for example, an unintended stress that occurs due to a difference between thermal expansion coefficients of the respective members to be concentrated in the center part of the tip of each of the pillars 531 when, for example, devices are cooled down. In this case, the quantum device 500 cannot maintain a good connection by the connection part 530. In other words, the quantum device 500 cannot maintain a high quality. Further, the yield is also reduced.

In order to solve the above problem, a quantum device 100 according to a first example embodiment capable of improving the quality and the yield has been made.

First Example Embodiment

Figure 2:
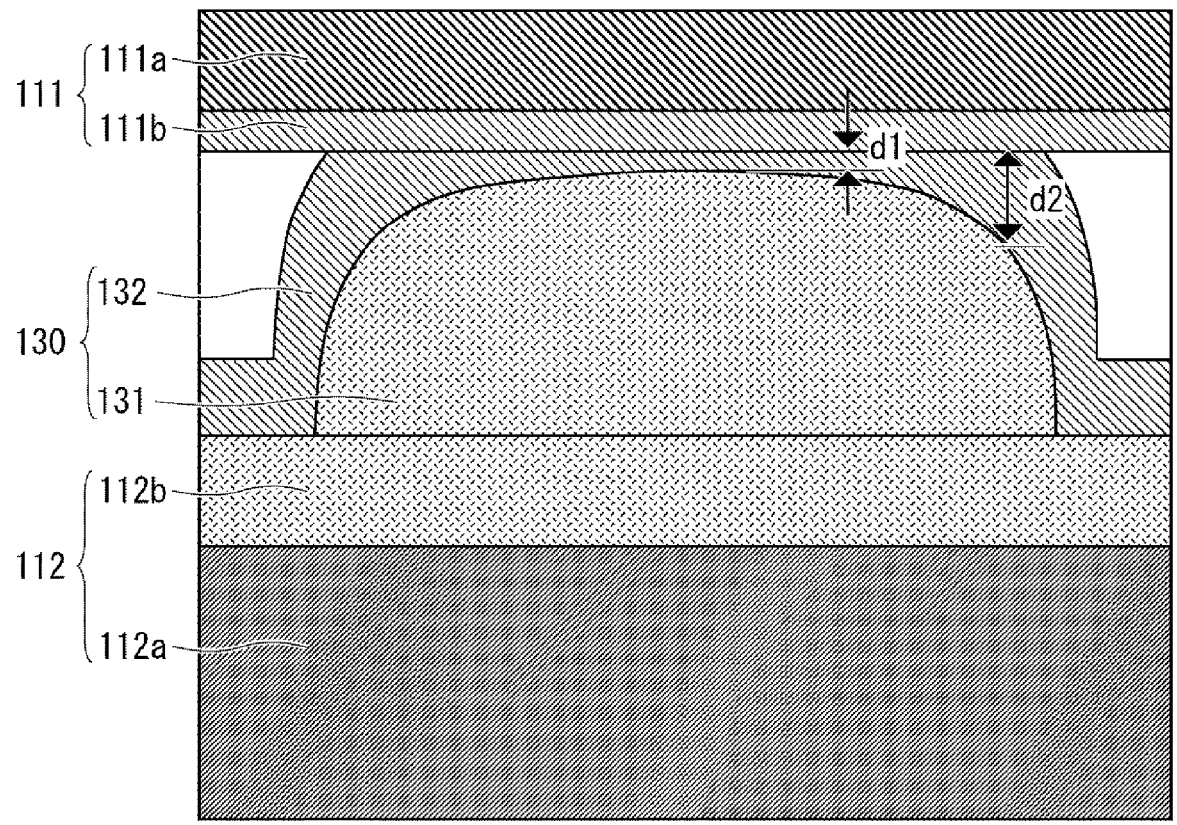
FIG. 2 is a schematic cross-sectional view in which a connection part of the quantum device shown in FIG. 1 is enlarged.

FIG. 1 is a schematic cross-sectional view of a quantum device 100 according to a first example embodiment. Further, FIG. 2 is a schematic cross-sectional view in which a connection part of the quantum device 100 shown in FIG. 1 is enlarged. The quantum device 100 is mounted on a quantum computer device and is placed in a cryogenic environment, whereby operations that utilize superconducting phenomena are achieved.

Specifically, the quantum device 100 includes a quantum chip 111, an interposer 112, a connection part 130, a sample table 116, a base substrate 128, and a bonding wire 126.

The interposer 112 and the base substrate 128 are arranged in proximity to each other on the main surface of the sample table 116. The sample table 116 includes a cooling function. Specifically, the sample table 116 is preferably made of copper (Cu), an alloy including copper, or aluminum (Al) in view of heat conduction. When the sample table 116 is made of aluminum, it may be insulated by alumite treatment.

The interposer 112 includes an interposer substrate 112a, a wiring layer 112b, and a metal film 112c. The wiring layer 112b is formed on one main surface (the surface that is opposite to the surface that contacts the sample table 116) of the interposer substrate 112a (hereinafter it may also be simply referred to as an interposer 112) and the metal film 112c is further formed on the surface of the wiring layer 112b as a part of the wiring layer 112b. The interposer 112 includes, for example, silicon (Si). The interposer 112 is not limited to the one that includes silicon as long as the quantum chip 111 can be mounted thereon, and the interposer 112 may include another electronic material such as sapphire, a compound semiconductor material (group IV, group III-V, group II-VI), glass, or ceramic. A surface of the interposer substrate 112a is preferably covered with a silicon oxide film (SiO2, TEOS film or the like).

The wiring layer 112b is formed of one of a superconducting material and a normal conducting material. The superconducting material is, for example, a metallic material such as niobium (Nb), niobium nitride (NbN), aluminum (Al), indium (In), lead (Pb), tin (Sn), rhenium (Re), palladium (Pd), titanium (Ti), titanium nitride (TiN), tantalum (Ta), and an alloy including any of them. The normal conducting material is, for example, a metallic material such as copper (Cu), silver (Ag), gold (Au), platinum (Pt), and an alloy including any of them. In this example, a case in which the wiring layer 112b is made of Cu, which is a normal conducting material, will be described.

Further, the metal film 112c is formed of a superconducting material. The superconducting material is, for example, a metallic material such as niobium (Nb), niobium nitride (NbN), aluminum (Al), indium (In), lead (Pb), tin (Sn), rhenium (Re), palladium (Pd), titanium (Ti), titanium nitride (TiN), tantalum (Ta), and an alloy including any of them. In this example, a case in which the metal film 112c is made of Nb will be described.

The quantum chip 111 includes a quantum chip body 111a and a wiring layer 111b. The wiring layer 111b is formed on one main surface of the quantum chip body 111a (hereinafter it may also be simply referred to as a quantum chip 111). The quantum chip 111 includes, for example, silicon (Si). The quantum chip 111 is not limited to the one that includes silicon as long as this quantum chip 111 is able to form quantum bits, and may include another electronic material such as sapphire or a compound semiconductor material (group IV, group III-V, group II-VI). Further, while the quantum chip 111 is preferably a monocrystal quantum chip, it may instead be a polycrystal or amorphous quantum chip. Further, the wiring layer 111b of the quantum chip 111 is formed of a superconducting material. In this example, a case in which the wiring layer 111b is made of Nb will be described.

The quantum chip 111 and the interposer 112 are arranged in such a way that the wiring layers thereof are opposed to each other.

The connection part 130 is provided between the quantum chip 111 and the interposer 112 and electrically connects the wiring layer 111b of the quantum chip 111 to the wiring layer 112b of the interposer 112. Accordingly, signals can be transferred between the quantum chip 111 and the interposer 112. Non-contact signal transfer may also be performed between the quantum chip 111 and the interposer 112.

Specifically, the connection part 130 includes a plurality of pillars 131 and a metal film 132. The plurality of pillars 131 are formed (arranged) in such a way that they are protruded from one main surface of the interposer 112. For example, a center part of the tip of each of the pillars 131 is projecting greatest from one main surface of the interposer 112 and outer peripheral parts of the tip of each of the pillars 131 are rounded (have a round shape). The metal film 132 is formed (arranged) on a surface of the plurality of pillars 131. The metal film 132 is formed on the surface of the plurality of pillars 131 in such a way that the metal film 132 is continuous with the metal film 112c formed on the surface of the wiring layer 112b of the interposer 112.

Note that the plurality of pillars 131 are formed of one of a superconducting material and a normal conducting material. In order to enhance the cooling performance, for example, they are preferably formed of a normal conducting material. In this example, a case in which the plurality of pillars 131 are made of Cu, which is a normal conducting material, will be described. Further, the metal film 132 is formed of a superconducting material, just like the metal film 112c. In this example, a case in which the metal film 132 is made of Nb will be described.

The wiring layer 112b of the interposer 112 (including the metal film 112c) and a wiring layer 127 of the base substrate 128 are connected to each other by the bonding wire 126. Accordingly, signal lines (terminals) of the quantum chip 111 are externally drawn out via the interposer 112 and the bonding wire 126.

Further, heat in the quantum chip 111 is dissipated to the sample table 116 that has a cooling function via the interposer 112. Accordingly, the quantum device 100 is maintained in a cryogenic state where superconducting phenomena can be utilized.

As shown in FIG. 2, in the connection part 130 provided in the quantum device 100, the thickness of the metal film 132 formed on the surface of the pillars 131 is not uniform. Specifically, a thickness d2 of the metal film 132 at outer peripheral parts of the tip of each of the pillars 131 is larger than a thickness d1 of the metal film 132 at the center part of the tip of each of the pillars 131. In other words, the metal film 132 is formed in such a way that its thickness gradually increases from the center part of the tip of each of the pillars 131 toward the outer peripheral parts of the tip of each of the pillars. Accordingly, the size of the area where the connection part 130 contacts the wiring layer 111b of the quantum chip 111 is large, whereby it is possible to prevent a stress from being concentrated in the center part of the tip of each of the pillars 131 even when an unintended stress occurs due to a difference between thermal expansion coefficients of the respective components when, for example, devices are cooled down. That is, even when an unintended stress occurs due to a difference between thermal expansion coefficients of the respective components when, for example, devices are cooled down, the stress that is applied to the pillars 131 can be dispersed. As a result, the quantum device 100 according to this example embodiment is able to ensure a stable connection between the quantum chip 111 and the interposer 112 by the connection part 130, whereby the quality and the yield can be improved.

Next, with reference to FIG. 3, a part of a method of manufacturing the quantum device 100 will be described briefly.

Figure 3:
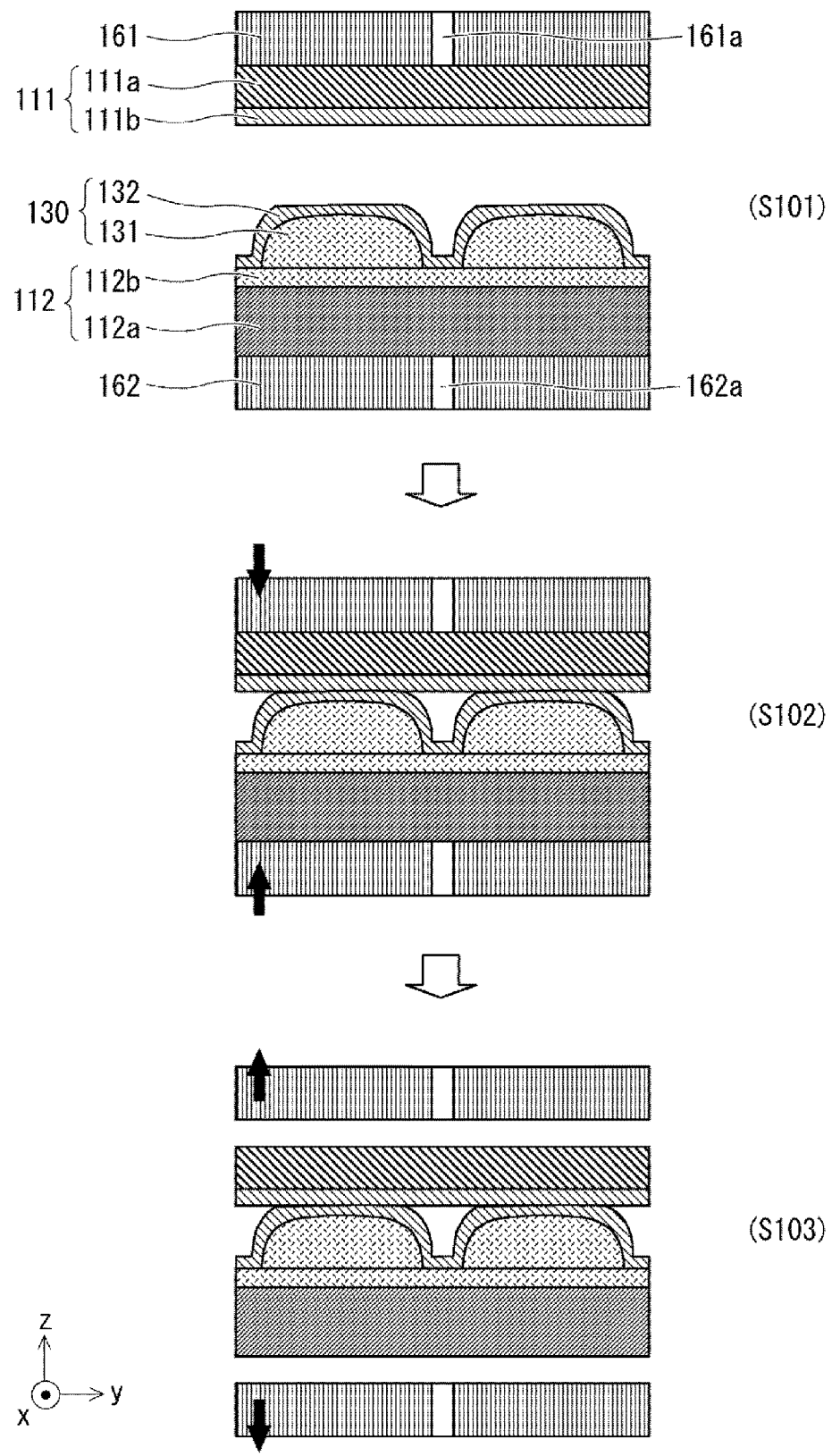
FIG. 3 is a diagram for describing a method of manufacturing the quantum device shown in FIG. 1.

FIG. 3 is a diagram for describing the method of manufacturing the quantum device 100.

First, the wiring layer 112b is formed on the main surface of the interposer 112 and then the plurality of pillars 131 are formed so as to be protruded from the main surface of the interposer 112. After that, the metal film 132 is formed on the surface of the plurality of pillars 131. The connection part 130 is thus formed. Note that the metal film 132 is formed so as to be continuous with the metal film 112c formed on the surface of the wiring layer 112b. In the process of forming the metal film 132, the metal film 132 is formed in such a way that the thickness thereof at the outer peripheral parts of the tip of each of the plurality of pillars 131 becomes larger than that at the center part of the tip of each of the plurality of pillars 131.

After that, by sucking up the quantum chip 111 from a suction hole 161a, the quantum chip 111 is attached to a mounting head 161. Further, by sucking up the interposer 112 from a suction hole 162a, the interposer 112 is attached to a mounting stage 162. Then, by moving at least one of the mounting head 161 and the mounting stage 162, the wiring layer 111b of the quantum chip 111 is opposed to the wiring layer 112b of the interposer 112 (Step S101).

After that, by further moving at least one of the mounting head 161 and the mounting stage 162, the connection part 130 formed in the wiring layer 112b of the interposer 112 is made to come in contact with the wiring layer 111b of the quantum chip 111 (Step S102).

After the quantum chip 111 is installed (fixed) on the interposer 112, the suction by the mounting head 161 and the mounting stage 162 is released, and the quantum device 100 is removed (Step S103).

As described above, in the quantum device 100 according to this example embodiment, the thickness of the metal film 132 at the outer peripheral parts of the tip of each of the plurality of pillars 131 is larger than that of the metal film 132 at the center part of the tip of each of the plurality of pillars 131. Accordingly, the size of the area where the connection part 130 contacts the wiring layer 111b of the quantum chip 111 becomes large, whereby it is possible to prevent a stress from being concentrated in the center part of the tip of each of the pillars 131 even when an unintended stress occurs due to a difference between thermal expansion coefficients of the respective components when, for example, devices are cooled down. As a result, the quantum device 100 according to this example embodiment is able to ensure a stable connection between the quantum chip 111 and the interposer 112 by the connection part 130, whereby the quality and the yield can be improved.

While the case in which the wiring layer 112b of the interposer 112 is formed of a normal conducting material and the metal film 112c formed on its surface is formed of a superconducting material has been described in this example embodiment, this is merely one example. The wiring layer 112b of the interposer 112 may instead be formed of a superconducting material such as Nb. In this case, the metal film 112c may not be formed on the surface of the wiring layer 112b. Further, in this case, for example, the wiring layer 112b of the interposer 112 and the metal film 132 formed on each surface of the plurality of pillars 131 are formed (integrally formed) so as to be continuous with each other.

Modified Example of Quantum Device 100

Figure 4:
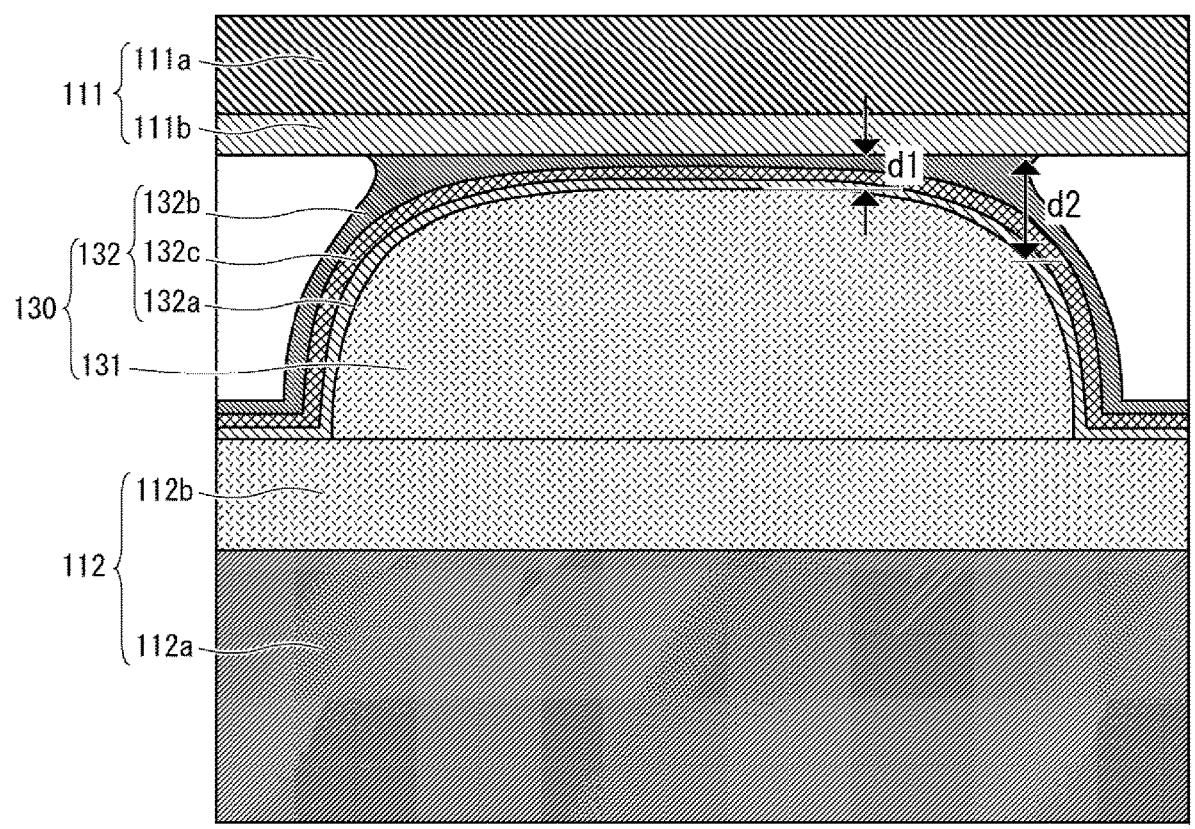
FIG. 4 is a schematic cross-sectional view in which a connection part of a modified example of the quantum device shown in FIG. 1 is enlarged.

FIG. 4 is a schematic cross-sectional view in which a connection part 130 of a quantum device 100a, which is a modified example of the quantum device 100, is enlarged. In the quantum device 100, the metal film 132 (and the metal film 112c), which is a component of the connection part 130, includes a single-layer structure. On the other hand, in the quantum device 100a, the metal film 132 (and the metal film 112c) includes a multi-layer structure.

Specifically, in the quantum device 100a, the metal film 132, which is one of the components of the connection part 130, includes a three-layer structure, the bottom layer 132a is made of Nb, the top layer 132b is made of In, and the intermediate layer 132c thereof is made of Ti or TiN. The intermediate layer 132c made of Ti or TiN is provided in order to improve adhesiveness between the Nb layer 132a and the In layer 132b. Since the metal film 112c provided on a surface of the wiring layer 112b so as to be continuous with the metal film 132 is similar to the case of the metal film 132, the descriptions thereof will be omitted.

Note that the bonding of the wiring layer 111b of the quantum chip 111 with the connection part 130 is performed by localized heating of the In layer 132b by ultrasonic bonding. Accordingly, dynamic damages to quantum devices are prevented.

Of the three-layer structure of the metal film 132, the top layer 132b that contacts the wiring layer 111b of the quantum chip 111 is formed of a metallic material having a high ductility (in this example, In) than those of the other layers. Owing to this metallic material having a high ductility, an unintended stress that occurs when, for example, devices are cooled down is further reduced. Accordingly, the quantum device 100a is able to ensure a more stable connection between the quantum chip 111 and the interposer 112 by the connection part 130, whereby it is possible to further improve the quality and the yield.

As described above, the quantum device 100a uses a metallic material having a high ductility as the top layer 132b that contacts the wiring layer 111b of the quantum chip 111 among the three layers of the metal film 132, whereby an unintended stress that occurs when, for example, devices are cooled down can be further reduced. Accordingly, the quantum device 100a is able to ensure a more stable connection between the quantum chip 111 and the interposer 112 by the connection part 130, whereby it is possible to further improve the quality and the yield.

While the example embodiments of the present disclosure have been described in detail with reference to the drawings, the specific configurations are not limited to the aforementioned ones and various design changes may be made without departing from the spirit of the present disclosure.

While the case in which the wiring layer 111b of the quantum chip 111 is made of Nb, the metal film 132 of the connection part 130 includes a three-layer structure, the bottom layer is made of Nb, the top layer is made of In, and the intermediate layer is made of Ti or TiN has been described in FIG. 4, this is merely one example.

For example, the wiring layer 111b of the quantum chip 111 may be made of Al and a layer made of Ti or TiN may be further provided in a part where the connection part 130 is arranged. Further, the metal film 132 of the connection part 130 may include a three-layer structure, which may be made of Al, Ti (or TiN), In, or an alloy including the same in order from the bottom layer to the top layer. Note that Sn, Pb, or an alloy including any of them may be used in place of In or an alloy including the same. The Ti layer or the TiN layer is provided so as to prevent alloying of Al and In. The same is applied also to the metal film 112c formed on the surface of the wiring layer 112b.

Alternatively, for example, the wiring layer 111b of the quantum chip 111 may be made of Ta, the metal film 132 of the connection part 130 may include a two-layer structure, the bottom layer may be made of Ta, and the top layer may be made of In, Sn, Pb, or an alloy including any of them. The same is applied also to the metal film 112c formed on the surface of the wiring layer 112b.

In short, it is sufficient that the metal film 132, which is one of the components of the connection part 130, include a single-layer structure or a multi-layer structure, and at least one layer be formed of a superconducting material.

According to the example embodiment, it is possible to provide a quantum device and a method of manufacturing the same capable of improving the quality.

While the disclosure has been particularly shown and described with reference to embodiments thereof, the disclosure is not limited to these embodiments. It will be understood by those of ordinary skill in the art that various changes in form and details may be made therein without departing from the spirit and scope of the present disclosure as defined by the claims.

The whole or part of the exemplary embodiments disclosed above can be described as, but not limited to, the following supplementary notes.

(Supplementary Note 1)

A quantum device comprising:
an interposer;
a quantum chip; and
a connection part that is provided between the interposer and the quantum chip and electrically connects a wiring layer of the interposer to a wiring layer of the quantum chip, wherein
the connection part comprises:
a plurality of pillars arranged on a main surface of the interposer; and
a metal film provided on a surface of the plurality of pillars in such a way that it contacts the wiring layer of the quantum chip and the thickness of the metal film at outer peripheral parts of the tip of each of the plurality of pillars becomes larger than the thickness of the metal film at a center part of the tip of each of the plurality of pillars.

[Supplementary Note 2]

The quantum device according to Supplementary Note 1, wherein the metal film includes a single-layer structure and is formed of a superconducting material.

[Supplementary Note 3]

The quantum device according to Supplementary Note 2, wherein the metal film is made of Nb or an alloy including the same.

[Supplementary Note 4]

The quantum device according to Supplementary Note 1, wherein the metal film includes a multi-layer structure, at least one layer being formed of a superconducting material.

[Supplementary Note 5]

The quantum device according to Supplementary Note 4, wherein the metal film includes a multi-layer structure, the top layer thereof being formed of a metallic material having a ductility higher than those of the other layers.

[Supplementary Note 6]

The quantum device according to Supplementary Note 4 or 5, wherein the metal film includes a multi-layer structure, a layer contacting the plurality of pillars being made of Nb or an alloy including the same, and the top layer being made of In or an alloy including the same.

[Supplementary Note 7]

The quantum device according to any one of Supplementary Notes 4 to 6, wherein the metal film includes a three-layer structure, a layer contacting the plurality of pillars being made of Nb or an alloy including the same, the top layer being made of In or an alloy including the same, and the layer provided therebetween being made of Ti or TiN.

[Supplementary Note 8]

The quantum device according to any one of Supplementary Notes 1 to 7, wherein the metal film is provided on a surface of the plurality of pillars so as to be continuous from a surface of the wiring layer of the interposer.

[Supplementary Note 9]

A method of manufacturing a quantum device, the method comprising:
arranging a plurality of pillars on a main surface of an interposer;
providing a metal film on a surface of the plurality of pillars; and
arranging a quantum chip on the main surface of the interposer in such a way that a wiring layer of the quantum chip contacts the metal film,
wherein the metal film is provided in such a way that the thickness of the metal film at outer peripheral parts of the tip of each of the plurality of pillars becomes larger than the thickness of the metal film at a center part of the tip of each of the plurality of pillars.

What is claimed is:

1. A quantum device comprising:
an interposer;
a quantum chip; and
a connection part that is provided between the interposer and the quantum chip and electrically connects a wiring layer of the interposer to a wiring layer of the quantum chip, wherein
the connection part comprises:
a plurality of pillars arranged on a main surface of the interposer; and
a metal film provided on a surface of the plurality of pillars in such a way that it contacts the wiring layer of the quantum chip and the thickness of the metal film at outer peripheral parts of the tip of each of the plurality of pillars becomes larger than the thickness of the metal film at a center part of the tip of each of the plurality of pillars.

2. The quantum device according to claim 1, wherein the metal film includes a single-layer structure and is formed of a superconducting material.

3. The quantum device according to claim 2, wherein the metal film is made of Nb or an alloy including the same.

4. The quantum device according to claim 1, wherein the metal film includes a multi-layer structure, at least one layer being formed of a superconducting material.

5. The quantum device according to claim 4, wherein the metal film includes a multi-layer structure, the top layer thereof being formed of a metallic material having a ductility higher than those of the other layers.

6. The quantum device according to claim 4, wherein the metal film includes a multi-layer structure, a layer contacting the plurality of pillars being made of Nb or an alloy including the same, and the top layer being made of In or an alloy including the same.

7. The quantum device according to claim 4, wherein the metal film includes a three-layer structure, a layer contacting the plurality of pillars being made of Nb or an alloy including the same, the top layer being made of In or an alloy including the same, and the layer provided therebetween being made of Ti or TiN.

8. The quantum device according to claim 1, wherein the metal film is provided on a surface of the plurality of pillars so as to be continuous from a surface of the wiring layer of the interposer.

9. A method of manufacturing a quantum device, the method comprising:
arranging a plurality of pillars on a main surface of an interposer;
providing a metal film on a surface of the plurality of pillars; and
arranging a quantum chip on the main surface of the interposer in such a way that a wiring layer of the quantum chip contacts the metal film,
wherein the metal film is provided in such a way that the thickness of the metal film at outer peripheral parts of the tip of each of the plurality of pillars becomes larger than the thickness of the metal film at a center part of the tip of each of the plurality of pillars.

* * * * *